(12) United States Patent
Murphy et al.

(10) Patent No.: US 9,388,336 B2
(45) Date of Patent: Jul. 12, 2016

(54) PROCESSES FOR PREPARING COLOR STABLE MANGANESE-DOPED COMPLEX FLUORIDE PHOSPHORS

(71) Applicant: GENERAL ELECTRIC COMPANY, Schenectady, NY (US)

(72) Inventors: James Edward Murphy, Niskayuna, NY (US); William Winder Beers, Chesterland, OH (US); Robert Joseph Lyons, Whitewater, WI (US); Fangming Du, Cleveland, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/568,396

(22) Filed: Dec. 12, 2014

(65) Prior Publication Data

US 2015/0166887 A1    Jun. 18, 2015

Related U.S. Application Data

(60) Provisional application No. 61/915,927, filed on Dec. 13, 2013.

(51) Int. Cl.
 *H01L 33/50* (2010.01)
 *C09K 11/61* (2006.01)

(52) U.S. Cl.
 CPC ............ *C09K 11/616* (2013.01); *H01L 33/502* (2013.01); *H01L 33/507* (2013.01)

(58) Field of Classification Search
 CPC ...... C09K 11/61; C09K 11/66; C09K 11/616; H01L 33/502; H01L 33/507; H01L 33/50
 USPC ......................................................... 257/98
 See application file for complete search history.

(56) References Cited

U.S. PATENT DOCUMENTS 2,522,074 A    9/1950   Urbach
3,576,756 A    4/1971   Russo (Continued)

FOREIGN PATENT DOCUMENTS

CN    102827601 A    12/2012
CN    102851026 A    1/2013

(Continued)

OTHER PUBLICATIONS

Frayret et al., "Solubility of (NH4)2SiF6, K2SiF6 and Na2SiF6 in acidic solutions", Chemical Physics Letters, Aug. 2006, pp. 356-364, vol. 427, Issue 4.

(Continued)

*Primary Examiner* — Selim Ahmed
(74) *Attorney, Agent, or Firm* — Mary Louise Stanford

(57) ABSTRACT

A process for preparing a color stable $Mn^{4+}$ doped complex fluoride phosphor of formula I includes $$A_x(M_{(1-m)}, Mn_m)F_y \qquad (I)$$

contacting a first aqueous HF solution comprising (1−m) parts of a compound of formula $H_xMF_y$, and a second aqueous HF solution comprising m*n parts of a compound of formula $A_x[MnF_y]$, with a third aqueous HF solution comprising (1−n) parts of the compound of formula $A_x[MnF_y]$ and a compound of formula $A_aX$, to yield a precipitate comprising the color stable $Mn^{4+}$ doped complex fluoride phosphor;
 wherein
  A is Li, Na, K, Rb, Cs, $NR_4$ or a combination thereof;
  M is Si, Ge, Sn, Ti, Zr, Al, Ga, In, Sc, Hf, Y, La, Nb, Ta, Bi, Gd, or a combination thereof;
  R is H, lower alkyl, or a combination thereof;
  X is an anion;
  a is the absolute value of the charge of the X anion;
  x is the absolute value of the charge of the $[MF_y]$ ion;
  y is 5, 6 or 7;
  $0 < m \le 0.05$;
  $0.1 \le n \le 1$.

14 Claims, 3 Drawing Sheets

(56) References Cited

U.S. PATENT DOCUMENTS

| | | | |
|---|---|---|---|
| 4,479,886 | A | 10/1984 | Kasenga |
| 6,103,296 | A | 8/2000 | McSweeney |
| 7,270,773 | B2 | 9/2007 | Manivannan et al. |
| 7,358,542 | B2 | 4/2008 | Radkov et al. |
| 7,422,703 | B2 | 9/2008 | Yi et al. |
| 7,497,973 | B2 | 3/2009 | Radkov et al. |
| 7,648,649 | B2 | 1/2010 | Radkov et al. |
| 7,847,309 | B2 | 12/2010 | Radkov et al. |
| 8,057,706 | B1 | 11/2011 | Setlur et al. |
| 8,252,613 | B1 | 8/2012 | Lyons et al. |
| 8,362,685 | B2 | 1/2013 | Masuda et al. |
| 8,427,042 | B2 | 4/2013 | Hata et al. |
| 8,491,816 | B2 | 7/2013 | Hong et al. |
| 8,497,623 | B2 | 7/2013 | Oguma et al. |
| 8,593,062 | B2 | 11/2013 | Murphy et al. |
| 8,703,016 | B2 | 4/2014 | Nammalwar et al. |
| 8,710,487 | B2 | 4/2014 | Lyons et al. |
| 2009/0001869 | A1 | 1/2009 | Tanimoto et al. |
| 2010/0090585 | A1 | 4/2010 | Seto et al. |
| 2010/0091215 | A1 | 4/2010 | Fukunaga et al. |
| 2011/0069490 | A1 | 3/2011 | Liu |
| 2012/0256125 | A1 | 10/2012 | Kayneyoshi et al. |
| 2012/0305972 | A1 | 12/2012 | Meyer et al. |
| 2013/0241396 | A1 | 9/2013 | Hiramatsu et al. |
| 2013/0264937 | A1 | 10/2013 | Sakuta et al. |
| 2013/0271960 | A1 | 10/2013 | Hong et al. |
| 2015/0069299 | A1 | 3/2015 | Pan et al. |

FOREIGN PATENT DOCUMENTS

| | | |
|---|---|---|
| EP | 1807354 B1 | 11/2008 |
| EP | 2629341 A1 | 8/2013 |
| GB | 1360690 A | 7/1974 |
| JP | 2013014715 A | 1/2013 |
| JP | 2013060506 A | 4/2013 |
| WO | 2009005035 A1 | 1/2009 |
| WO | 2009119486 A1 | 10/2009 |
| WO | 2011073951 A2 | 6/2011 |
| WO | 2013088313 A1 | 6/2013 |
| WO | 2013121355 A1 | 8/2013 |
| WO | 2013138347 A1 | 9/2013 |
| WO | 2013144919 A1 | 10/2013 |
| WO | 2013158929 A1 | 10/2013 |
| WO | 2014068440 A1 | 5/2014 |

OTHER PUBLICATIONS

Paulusz, "Efficient Mn(IV) Emission in Fluorine Coordination", Journal of The Electrochemical Society, Jul. 1973, pp. 942-947, vol. 120, Issue 7.

Liao et al., "Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Hu et al., "Preparation and luminescent properties of (Ca1-x, Srx)S:Eu2+ red-emitting phosphor for white LED", Journal of Luminescence, ScienceDirect, Feb. 1, 2005,vol. 111, Issue 3, pp. 139-145.

Murphy et al., "Color Stable Red-Emitting Phosphors", U.S. Appl. No. 14/208,592, filed Mar. 13, 2014.

Murphy et al., "Color Stable Red-Emitting Phosphors", U.S. Appl. No. 14/285,746, filed May 23, 2014.

Nammalwar et al., "Phosphor Materials and Related Devices", U.S. Appl. No. 14/348,244, filed Mar. 28, 2014.

Murphy et al., "Method and System for Storage of Perishable Items", U.S. Appl. No. 13/665,514, filed Oct. 31, 2012.

Brewster et al., "Phosphor Assembly for Light Emitting Devices", U.S. Appl. No. 13/875,534, filed May 2, 2013.

Murphy et al., "Color Stable Red-Emitting Phosphors", U.S. Appl. No. 61/791,511, filed Mar. 15, 2013.

General Electric Company, "Color Stable Red-Emitting Phosphors", PCT Patent Application PCT/US14/027733, filed Mar. 14, 2014.

Murphy, "Processes for Preparing Color Stable Manganese-Doped Phosphors", U.S. Appl. No. 61/868,633, filed Aug. 22, 2013.

Setlur et al., "LED Package With Red-Emitting Phosphors", U.S. Appl. No. 14/073,141, filed Nov. 6, 2013.

Bera et al., "Optimization of the Yellow Phosphor Concentration and Layer Thickness for Down-Conversion of Blue to White Light", Journal of Display Technology, pp. 645-651, vol. 6, No. 12, Dec. 2010.

Murphy et al., "Red-Emtting Phosphors and Associated Devices", U.S. Appl. No. 14/303,020, filed Jun. 12, 2014.

Setlur et al., "Color Stable Red-Emitting Phosphors", U.S. Appl. No. 14/302,823, filed Jun. 12, 2014.

Setlur et al., "LED Package With Red-Emitting Phosphors", U.S. Appl. No. 14/304,098, filed Jun. 13, 2014.

Takahashi et al., "Mn4+-Activated Red Photoluminescence in K2SiF6 Phosphor", Journal of the Electrochemical Society, pp. E183-E188, vol. 155, Issue 12, 2008.

International Search Report and Written Opinion dated Jul. 14, 2014 which was issued in connection with PCT Patent Application No. PCT/US2014/027733.

Garcia et al., "Color Stable Red-Emitting Phosphors", U.S. Appl. No. 14/302,907, filed Jun. 12, 2014.

Kasa et al., "Red and Deep Red Emissions from Cubic K2SiF6:Mn4+ and Hexagonal K2MnF6 Synthesized in HF/KMnO4/KHF2/Si Solutions", Journal of The Electrochemical Society, ECS, Jan. 18, 2012, vol. 159, Issue 4, J89-J95, Japan.

Black et al., "Excitation and luminescence spectra of dipotassium hexafluoromanganate(IV)", Journal of the Chemical Society, Royal Society of Chemistry, Dalton Transactions, 1974, 977-981, Issue 9.

PROCESSES FOR PREPARING COLOR STABLE MANGANESE-DOPED COMPLEX FLUORIDE PHOSPHORS

This application claims the benefit of U.S. Provisional Application No. 61/915,927, entitled "PROCESSES FOR PREPARING COLOR STABLE MANGANESE-DOPED COMPLEX FLUORIDE PHOSPHORS", filed Dec. 13, 2013, and which is incorporated herein by reference in its entirety.

BACKGROUND

Red-emitting phosphors based on complex fluoride materials activated by $Mn^{4+}$, such as those described in GB 1360690, U.S. Pat. Nos. 3,576,756, 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI) >80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under use conditions. It is possible to reduce this degradation using post-synthesis processing steps, as described in U.S. Pat. No. 8,252,613. However, development of alternative methods for improving stability of the materials is desirable.

BRIEF DESCRIPTION

Briefly, the present invention relates to a process for preparing a color stable $Mn^{4+}$ doped complex fluoride phosphor of formula I,

$$A_x(M_{(1-m)}Mn_m)F_y \qquad (I)$$

the process comprising contacting a first aqueous HF solution comprising (1–m) parts of a compound of formula $H_xMF_y$, and a second aqueous HF solution comprising m*n parts of a compound of formula $A_x[MnF_y]$, with a third aqueous HF solution comprising (1–n) parts of the compound of formula $A_x[MnF_y]$ and a compound of formula $A_aX$, to yield a precipitate comprising the color stable $Mn^{4+}$ doped complex fluoride phosphor;

wherein

A is Li, Na, K, Rb, Cs, $NR_4$ or a combination thereof;

M is Si, Ge, Sn, Ti, Zr, Al, Ga, In, Sc, Hf, Y, La, Nb, Ta, Bi, Gd, or a combination thereof;

R is H, lower alkyl, or a combination thereof;

X is an anion;

a is the absolute value of the charge of the X anion;

x is the absolute value of the charge of the $[MF_y]$ ion;

y is 5, 6 or 7;

$0<m\leq0.08$;

$0.1\leq n\leq 1$.

In another aspect, the present invention relates to $Mn^{4+}$ doped complex fluoride phosphors with improved stability prepared by the process, and LED lighting apparatuses that include the complex fluoride phosphors prepared by the process, disposed on a surface of an LED chip.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
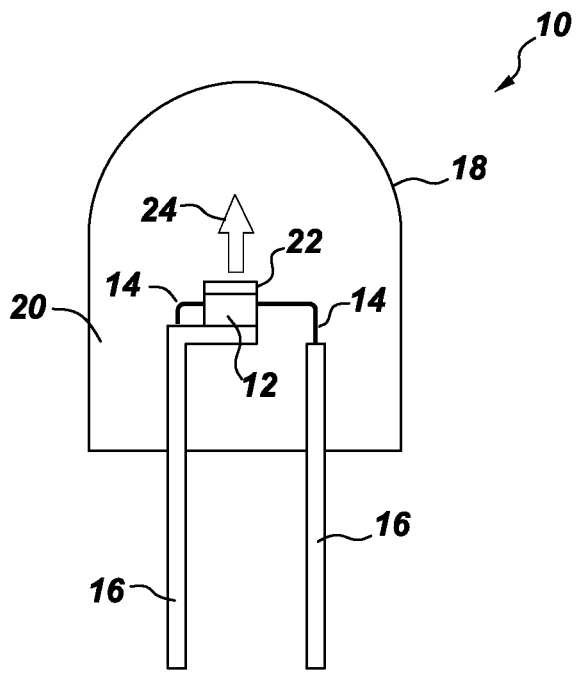
FIG. 1 is a schematic cross-sectional view of a lighting apparatus according to the present invention.

Complex fluoride phosphors that may be prepared by the processes of the present invention are coordination compounds containing a coordination center M surrounded by fluoride ions acting as ligands, and charge-compensated by counter ions A. The host lattice material $A_xMF_y$ is combined with the activator material $A_xMnF_y$, and the $Mn^{4+}$ activator or dopant ion also acts as a coordination center, substituting part of the centers of the host lattice M. The host lattice, including the counter ions, may further modify the excitation and emission properties of the activator ion.

Processes for preparing the activator materials typically yield a product of a lower than desired purity due to contamination with heavy metals or compounds with manganese in the 2+ or 3+ oxidation state. It may be desirable to purify the activator material before preparing the phosphor. Accordingly, in yet another aspect, the present invention relates to a process for removing impurities that have solubility in hydrofluoric acid that differs significantly from the activator ion, and the net effect is that an improved complex fluoride phosphor may be prepared. The compound of formula $A_xMnF_y$ is dissolved in aqueous HF to form a solution that is saturated or nearly saturated. The solution may be filtered to remove any insoluble materials. Then the activator material is precipitated, and the precipitate is isolated, and may be washed, filtered and dried. Precipitation may be effected by addition of an excess amount of the compound of formula AF, in particular embodiments, KF. Other methods to induce precipitation include decreasing the temperature of the solution, and adding an antisolvent such as acetic acid or acetone. Combinations of the methods may also be used.

Processes for preparing a color stable $Mn^{4+}$ doped complex fluoride phosphor of formula I according to the present invention include contacting a first aqueous HF solution containing an acid of formula $H_xMF_y$, which is a source of the $MF_y$ ion, and a second aqueous HF solution containing an activator material of formula Ax[MnFy], with a third aqueous HF solution containing the activator material and a compound of formula $A_aX$, to yield the color stable $Mn^{4+}$ doped phosphor as a precipitate. In some embodiments, a fourth solution containing an additional source of the $A^+$ ion ($K^+$ in many embodiments) may be used. In the processes according to the present invention, the reactants are supplied as separate solutions and combined to produce a color stable phosphor product gradually, that is, over a period of time, in contrast to methods for preparing the phosphors described in the patents cited above, where the reactants are dissolved in a common aqueous hydrofluoric acid solution, and the phosphor product is precipitated by adding a non-solvent, or common ion, or simply evaporating the solvent. Although the inventors do not wish to be held to any particular theory to explain the improvement in color stability that can result from using the processes according to the present invention, it is believed that the processes according to the present invention allow for incorporation of the $Mn^{4+}$ dopant throughout the phosphor particles, whereas the processes is which the product is precipitated all at once may result in particles having a graded composition, with manganese preferentially disposed at or near the surface of the particle. A homogenous distribution of manganese may prevent concentration quenching and consequent loss of quantum efficiency (QE) from clustering of the dopant ions.

The processes according to the present invention may be performed in a batch mode or continuously. For a batch process, the first and second solutions are added gradually to the third solution, and the product is formed over time. For a continuous process, the three solutions may be mixed gradually.

Concentration of the three solutions is chosen so that the product has low solubility in the reaction medium and readily precipitates. The amount of activator material in the second solution, m*n, and in the third solution, 1−n, is determined by the desired ratio between the two solutions, n, and by the amount of Mn to be incorporated in the product. The ratio of the amount of Mn in the second to the amount in the third solution ranges from greater than 0.1 to less than 1, particularly from ≤0.25 to ≤0.9, more particularly from ≤0.5 to ≤0.9, and most particularly from ≤0.6 to ≤0.8. In particular embodiments, n is about 0.7. The amount of Mn in the product is m, and m ranges between 0 and less than 0.08. The amount of activator material used in the preparation is at least m, and in some embodiments an additional amount of the activator material may be included in the second or third solutions, or both the second and third solutions, so that the total amount of Mn charged to the solution(s) is greater than m, since some of the starting activator material may not be incorporated in the product. In particular embodiments, the color stable $Mn^{4+}$ doped complex fluoride phosphor is $K_2(Si_{(1-m)}, Mn_m) F_6$.

The compound of formula $A_aX$ is an ionic compound that can serve as a source of the A+ ion. Examples of suitable materials include $KF$, $KHF_2$, $KNO_3$, and $CH_3COOK$. In particular embodiments, the compound is selected from $KF$, $KHF_2$, and combinations thereof. The amount of the compound for use in the third solution ranges from about 1 part (mole) to at least about 3. In some embodiments, a fourth solution containing the compound may additionally be contacted with the first, second and third solutions.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where 0≤i; 0≤j; 0≤k and l+j+k=1) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 includes a color stable $Mn^{4+}$ doped complex fluoride phosphor prepared by the process, and deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of flux across the tape and can result in less damage to the phosphor. Suitable materials for the diluent include cubic fluoride compounds such as LiF, $MgF_2$, $CaF_2$, $SrF_2$, $AlF_3$, $K_2NaAlF_6$, $KMgF_3$, $CaLiAlF_6$, $KLiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
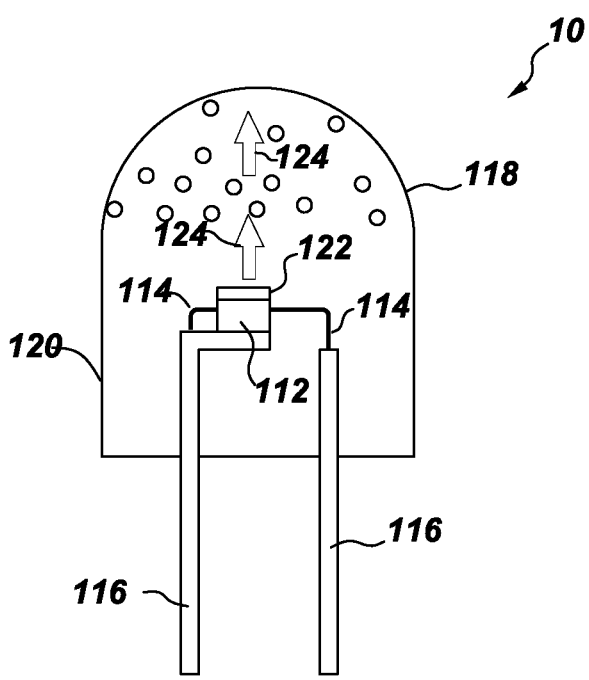
FIG. 2 is a schematic cross-sectional view of a lighting apparatus according to the present invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by color stable $Mn^{4+}$ doped complex fluoride phosphor 122 prepared by the processes of the present invention, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
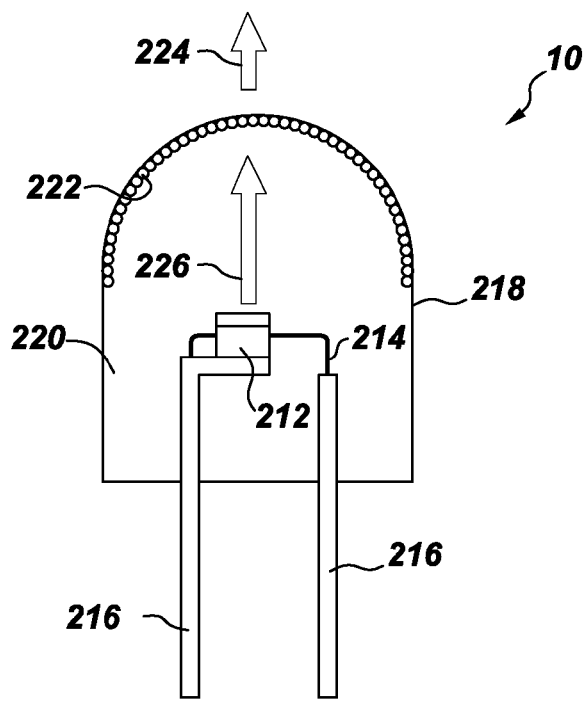
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222, which includes a color stable $Mn^{4+}$ doped complex fluoride phosphor prepared by a process according to the present invention, is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
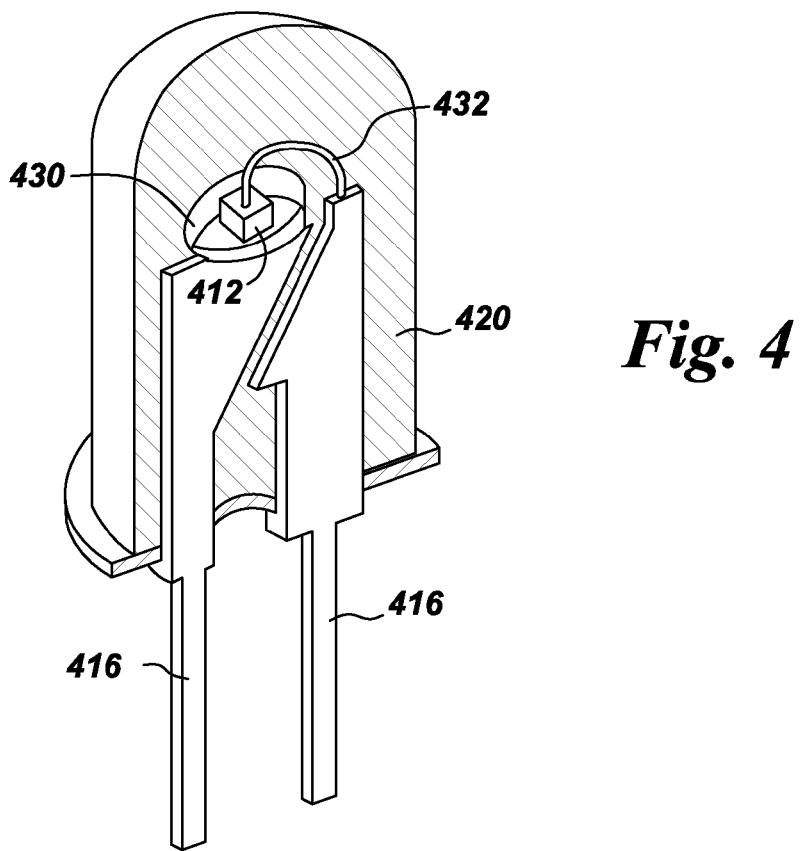
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
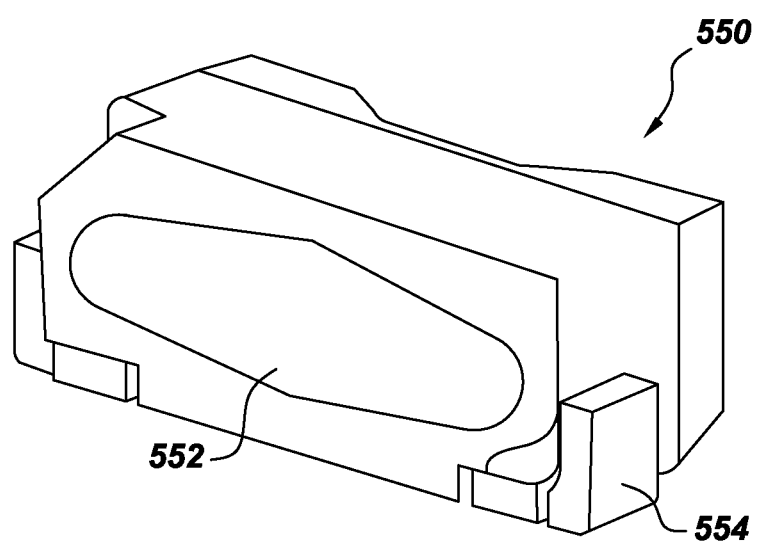
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{4+}$ doped complex fluoride phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, orange, or other color phosphors may be used in the blend to customize the white color of the resulting light and produce higher CRI sources.

Suitable phosphors for use along with the phosphor of formula I include, but are not limited to:
$((Sr_{1-z}(Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}$ (CaSiG); $(Sr,Ca,Ba)_3Al_{1-x}Si_xO_{4+x}F_{1-x}:Ce^{3+}$ $((Ca, Sr, Ce)_3(Al, Si)(O, F)_5$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:$ $Eu^{2+}, Mn^{2+}$; $(Y,Lu)_2WO_6:Eu^{3+},Mo^{6+}$; $(Ba,Sr,Ca)_\beta Si_\gamma N_\mu$: $Eu^{2+}$ (wherein $2\beta+4\gamma=3\mu$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5 \leq u \leq 1$, $0 < v \leq 0.1$, and $0 \leq w \leq 0.2$); $(Y,Lu,Gd)_{2-\phi}Ca_\phi Si_4 N_{6+\phi}C_{1-\phi}:Ce^{3+}$, (wherein $0 \leq \phi \leq 0.5$); $(Lu,Ca,Li,Mg,Y)$, $\alpha$-SiAlON doped with $Eu^{2+}$ and/or $Ce^{3+}$; $\beta$-SiAlON:$Eu^{2+}$; $(Ca,Sr,)AlSiN_3:Eu^{2+}(Ca,Sr,Ba)SiO_2N_2:Eu^{2+},Ce^{3+}$; $3.5MgO*0.5MgF_2*GeO_2:Mn^{4+}$; $Ca_{1-c-f}Ce_cEu_fAl_{1+c}Si_{1-c}N_3$, (where $0 \leq c \leq 0.2$, $0 \leq f \leq 0.2$); $Ca_{1-h-r}Ce_hEu_rAl_{1-h}(Mg,Zn)_hSiN_3$, (where $0 \leq h \leq 0.2$, $0 \leq r \leq 0.2$); $Ca_{1-2s-t}Ce_s(Li,Na)_sEu_tAlSiN_3$, (where $0 \leq s \leq 0.2$, $0 \leq f \leq 0.2$, $s+t>0$); and $Ca_{1-\sigma-\chi-\phi}Ce_\sigma(Li,Na)_\chi Eu_\phi Al_{1+\sigma-\chi}Si_{1-\sigma+\chi}N_3$, (where $0 \leq \sigma \leq 0.2$, $0 \leq \chi \leq 0.4$, $0 \leq \phi \leq 0.2$).

In particular, suitable phosphors for use in blends with the phosphor of formula I are $(Ca, Ce)_3Sc_2Si_3O_{12}$ (CaSiG); $(Sr, Ca,Ba)_3Al_{1-x}Si_xO_{4+x}F_{1-x}:Ce^{3+}$ $((Ca, Sr, Ce)_3(Al, Si)(O, F)_5$ (SASOF)); $(Ba,Sr,Ca)_2Si_{1-\xi}O_{4-2\xi}:Eu^{2+}$ (wherein $0 \leq \xi \leq 0.2$); $(Y,Gd,Tb,La,Sm,Pr,Lu)_3(Al,Ga)_{5-\alpha}O_{12-3/2\alpha}:Ce^{3+}$ (wherein $0 \leq \alpha \leq 0.5$); $(Ba,Sr,Ca)_\beta Si_\gamma N_\mu:Eu^{2+}$ (wherein $2\beta+4\gamma=3\mu$); $(Y,Lu,Gd)_{2-\phi}Ca_\phi Si_4N_{6+\phi}C_{1-\phi}:Ce^{3+}$, (wherein $0 \leq \phi \leq 0.5$); $\beta$-SiAlON:$Eu^{2+}$; and $(Ca,Sr,)AlSiN_3:Eu^{2+}$.

More particularly, a phosphor that emits yellow-green light upon excitation by the LED chip may be included in a phosphor blend with a color stable $Mn^{4+}$ doped complex fluoride phosphor produced by a process according to the present invention, for example a $(Y,Gd,Tb,La,Sm,Pr,Lu)_3(Al,Ga)_{5-\alpha}O_{12-3/2}\alpha:Ce^{3+}$ (wherein $0 \leq \alpha \leq 0.5$).

The color stable $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

Example 1

$K_2MnF_6$ Synthesis $K_2MnF_6$ was synthesized from $KMnO_4$, KF, $H_2O_2$, and aqueous HF by a one-step, one-pot method based on Bode (*Angew. Chem.* 65 (11): 304):

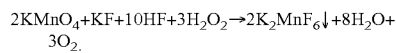

A 4-L polyethylene beaker, equipped with a Teflon-coated magnetic stirring bar, was charged with 50% aqueous HF (1 L) and cooled with an ice bath. Then KF (240 g, 4.13 mol) and finely powdered $KMnO_4$ (15 g, 94.9 mmol) are added and the mixture was vigorously stirred for 15 min. The stirring was stopped and any undissolved material was allowed to settle. The supernatant solution was decanted into a second beaker to assure the absence of any undissolved $KMnO_4$, which could make the endpoint recognition in the subsequent titration step difficult. To the cold dark purple solution, 30% aqueous $H_2O_2$ was slowly added with an eyedropper. After the addition of each 5-10 drops, further additions are halted until $O_2$ evolution has ceased. After the addition of about 20 mL of $H_2O_2$, the endpoint was being approached. A brownish golden precipitate was formed and the endpoint can be judged by stopping the stirring and observing the color of the supernatant solution. The reaction was judged to be complete when the color of the solution changed from purple to medium reddish brown. The golden yellow $K_2MnF_6$ precipitate was collected using a plastic Buchner funnel with Teflon filter paper. The precipitate was washed twice with cold acetone (10 mL each) and pumped to dryness to yield 18.44 g (78.6%, based on $KMnO_4$) of yellow $K_2MnF_6$.

Example 2

$K_2MnF_6$ Purification

A saturated or nearly saturated solution of $K_2MnF_6$ in HF was prepared using 20.3 g of $K_2MnF_6$ and 282 mL of 48 wt % HF and vacuum filtering the product. A treatment solution of 40.6 g KF dissolved in 41 mL of 48% HF was also prepared. The KF solution was dropwise to $K_2MnF_6$ solution with stirring to form a precipitate. The supernatant was poured off, and then the vacuum filter slurry was vacuum filtered, washed four times with cold acetone, and dried in a vacuum desiccator.

Example 3

$K_2MnF_6$ Purification

A saturated or nearly saturated solution of $K_2MnF_6$ in 70% HF was prepared using 10 grams of $K_2MnF_6$ in 40 ml 70 wt % HF. A treatment solution of 10 g $KHF_2$ dissolved in 10 ml of 48% HF was also prepared. The $KHF_2$ solution was added to the $K_2MnF_6$ solution with stirring. The resulting slurry was vacuum filtered and covered 4 times with acetone, and the $K_2MnF_6$ product was dried in a vacuum desiccator.

Example 4

Elemental Analysis by ICP-MS

The levels of Al, Ca, Cr, Cu, Fe, Na, Ni, and Zr in samples of the phosphor as synthesized and of Example 2 were determined. Results are shown in Table 1. Levels of contaminants were reduced significantly by the purification process.

TABLE 1

| | ICP Data | | | | | | | |
|---|---|---|---|---|---|---|---|---|
| Example No. | Al | Ca | Cr | Cu | Fe | Na | Ni | Zr |
| As synthesized | 13 | 460 | 10 | 14 | 31 | 420 | 10 | 11 |
| 2 | <3* | 260 | <5* | <2* | 7 | <20* | <5* | <3* |

*below detectable limits

Examples 5-18

Preparation of $K_2SiF_6$: $Mn^{4+}$ Phosphor

General Procedures
Phosphor Preparation

Fluorosilicic acid, $H_2SiF_6$, and HF are mixed with stirring to form a first solution. A hydrofluoric acid solution containing a source of $K^+$ is prepared by pouring the hydrofluoric acid into a beaker containing KF or $KHF_2$, and potassium hexafluoromanganate (PFM), $K_2MnF_6$, with stirring to dissolve the solids. This is called the receiving solution. A third solution containing aqueous HF and $K_2MnF_6$ is prepared; this is called the PFM solution. The fluorosilicic acid and PFM solutions are added separately and gradually over a period of about 10 minutes to the receiving solution with stirring. Addition of the fluorosilicic acid solution is started prior to the PFM addition, usually 1-2 minutes earlier. After the additions are completed, the suspension is stirred for few minutes, then stirring is stopped, the phosphor is allowed to settle and the supernatant is decanted.

A treatment solution composed of a saturated or nearly saturated solution of $K_2SiF_6$ in HF is prepared by adding $K_2SiF_6$ to a polypropylene beaker containing 48% HF. The beaker is covered, stirred for a minimum of 15 minutes and the solution was vacuum filtered using a 0.65 micron pore size Teflon filter. The treatment solution is added to the beaker containing the phosphor and stirred for about 15 minutes. After the stirring is stopped, the phosphor is allowed to settle and the treatment solution is decanted. The phosphor is vacuum filtered, rinsed three times with acetone, dried under vacuum and sifted to yield Mn-doped $K_2SiF_6$.

TABLE 2

| Example No. | % PFM in PFM solution | % PFM in receiving solution | K (2.05 mol) | Comments |
|---|---|---|---|---|
| 5 | 0 | 100 | | |
| 6 | 25 | 75 | | |
| 7 | 25 | 75 | | PFM purified by process of Example 2 |
| 8 | 50 | 50% | | |
| 9 | 50 | 50 | | PFM purified by process of Example 2 |
| 10 | 70 | 30 | | |
| 11 | 90 | 10 | | |
| 12 | 90 | 10 | | Started Mn drip at 30 s, increased starting Mn 12% |
| 13 | 50 | 50 | $KHF_2$ | |
| 14 | 50 | 50 | KF | |
| 15 | 70 | 30 | $KHF_2$ | |
| 16 | 70 | 30 | KF | |
| 17 | 70 | 30 | Both* | *$KHF_2$ only in receiving solution and 1 mol excess KF added dropwise |
| 18 | 90 | 10 | $KHF_2$ | |
| 19 | 90 | 10 | KF | |
| 20 | 90 | 10 | $KHF_2$ | Started Mn drip at 30 s, increased starting Mn 12% |

Detailed Preparation for the Phosphor of Example 7

A solution of $KHF_2$ in 48% hydrofluoric acid was prepared by pouring 65 mL of 48% hydrofluoric acid into a beaker (Beaker A) containing 8.1 grams of $KHF_2$. Then, $K_2MnF_6$ (0.219 g, 0.00089 mol) was added to the solution with stirring to dissolve the solids. $H_2SiF_6$ (15 ml of 35% $H_2SiF_6$, 0.036 mol) and 60 ml of 48% HF was poured into a second beaker (Beaker B) and stirred. HF (21 mL of 48% HF) was poured into a third beaker (Beaker C) containing $K_2MnF_6$ (0.219 g, 0.00089 mol) and stirred to dissolve solids. While stirring beaker A, the contents of beaker B and C were added dropwise over about 7 minutes. After the addition was completed, the suspension was stirred for an additional 5 minutes, then stirring was stopped, the phosphor was allowed to settle and the supernatant was decanted. The treatment solution (80 mL) was then added to the beaker and the product was stirred for 15 minutes. The stirring was stopped, the phosphor was allowed to settle and the treatment solution was decanted. The phosphor was vacuum filtered, rinsed three times with acetone, dried under vacuum and sifted to yield Mn-doped $K_2SiF_6$.

A treatment solution was prepared by adding 23 g of $K_2SiF_6$ to a polypropylene beaker containing 500 mL of 48% HF. The beaker was covered, stirred for a minimum of 15 minutes and the solution was vacuum filtered using a 0.65 micron pore size Teflon filter to yield the treatment solution, which is a saturated solution of $K_2SiF_6$ in HF

TABLE 3

| Example No. | Rel. QE (%) | 450 nm Abs. (%) | Tau (ms) | D50 size (µm) | Yield (g) | [Mn] Wt % |
|---|---|---|---|---|---|---|
| Control | 100 | 61.7 | 8.7 | 27 | — | |
| 5 | 87 | 66 | 8.11 | 32 | | |
| 6 | 93 | 65 | 8.35 | 31.7 | | |
| 7 | 100 | 69 | | | | |
| 8 | 98 | 64 | 8.5 | 32 | | |
| 9 | 111 | 70 | | | | |
| 10 | 102 | 58 | 8.60 | 31.6 | | |
| 11 | 103 | 50 | 8.66 | 30 | | |
| 12 | 99 | 58 | 8.67 | 34.6 | | |
| 13 | 96.3 | 60 | 8.46 | 31.7 | 6.17 | |
| 14 | 97.1 | 64 | 8.4 | 32 | — | 0.73 |
| 15 | 102.4 | 56 | 8.66 | 31.2 | 6.15 | |
| 16 | 102.4 | 58 | 8.60 | 31.6 | 6.3 | 0.53 |
| 17 | 100.1 | 60 | 8.64 | 32 | 9.2 | 0.53 |
| 18 | 102.9 | 51 | 8.68 | 33.3 | 6.0 | |
| 19 | 103.5 | 50 | 8.66 | 30 | 6.5 | 0.32 |
| 20 | 98.8 | 58 | 8.67 | 34.6 | 6.1 | |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for preparing a color stable $Mn^{4+}$ doped complex fluoride of formula I,

$$A_x(M_{(1-m)},Mn_m)F_y \qquad (I)$$

the process comprising contacting a first aqueous HF solution comprising (1−m) parts of a compound of formula $H_xMF_y$, and
a second aqueous HF solution comprising m*n parts of a compound of formula $A_x[MnF_y]$, with a third aqueous HF solution comprising (1−n) parts of the compound of formula $A_x[MnF_y]$ and a compound of formula $A_aX$,
to yield a precipitate comprising the color stable $Mn^{4+}$ doped complex fluoride;
wherein
A is Li, Na, K, Rb, Cs, $NR_4$ or a combination thereof;
M is Si, Ge, Sn, Ti, Zr, Al, Ga, In, Sc, Hf, Y, La, Nb, Ta, Bi, Gd, or a combination thereof;
R is H, lower alkyl, or a combination thereof;
X is an anion;
a is the absolute value of the charge of the X anion;
x is the absolute value of the charge of the $[MF_y]$ ion;
y is 5, 6 or 7;
0<m≤0.05;
0.1≤n≤1.

2. A process according to claim 1, wherein n ranges from 0.25 to 0.95.

3. A process according to claim 1, wherein n ranges from 0.5 to 0.9.

4. A process according to claim 1, wherein n ranges from 0.6 to 0.8.

5. A process according to claim 1, wherein n is about 0.7.

6. A process according to claim 1, wherein the $Mn^{4+}$ doped complex fluoride of formula I is  $K_2(Si_{(1-m)},Mn_m)F_6$.

7. A process according to claim 1, wherein the salt of formula $A_aX$ is selected from KF, $KHF_2$, and combinations thereof.

8. A process according to claim 1, wherein the first and second aqueous HF solutions are added gradually to the third solution.

9. A process according to claim 1, additionally comprising precipitating the compound of formula $A_xMnF_y$ from a concentrated aqueous HF solution, and isolating the precipitate, prior to the contacting step.

10. An LED lighting apparatus comprising a complex fluoride prepared by the process of claim 1.

11. An LED lighting apparatus comprising an LED chip; and a complex fluoride prepared by the process of claim 1, disposed on a surface of the LED chip.

12. A process for preparing a color stable $Mn^{4+}$, doped complex fluoride phosphor of formula $K_2(Si_{(1-m)}, Mn_m)F_6$, the process comprising contacting a first aqueous HF solution comprising (1−m) parts of a compound of formula $H_2SiF_6$, and
a second aqueous HF solution comprising m*n parts of a compound of formula $K_2MnF_6$, with a third aqueous HF solution comprising (1−n) parts of the compound of formula $K_2MnF_6$ and a compound selected from KF, $KHF_2$, and combinations thereof;
to yield a precipitate comprising the color stable $Mn^{4+}$, doped complex fluoride,
wherein
$0 < m \leq 0.08$; and
$0.1 \leq n \leq 1$.

13. A process according to claim 1, wherein n ranges from 0.6 to 0.8.

14. A process according to claim 1, additionally comprising, prior to the gradual addition step, precipitating the compound of formula $K_2(Si_{(1-m)}, Mn_m)F_6$ from a concentrate aqueous HF solution, and isolating the precipitate.

* * * * *